(12) United States Patent
Chan et al.

(10) Patent No.: US 9,461,217 B2
(45) Date of Patent: Oct. 4, 2016

(54) LED DEVICES WITH REDUCED REFLECTION AND AN LED DISPLAY INCLUDING SAME

(71) Applicant: Cree Huizhou Solid State Lighting Company Limited, Huizhou (CN)

(72) Inventors: Chi Keung Chan, Hong Kong (CN); Xiang Fei, Guangdong (CN)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 14/296,749

(22) Filed: Jun. 5, 2014

(65) Prior Publication Data
US 2014/0346545 A1 Nov. 27, 2014

Related U.S. Application Data

(63) Continuation of application No. PCT/CN2012/070069, filed on Jan. 5, 2012.

(51) Int. Cl.
*H01L 33/58* (2010.01)
*H01L 33/54* (2010.01)

(52) U.S. Cl.
CPC ............ *H01L 33/58* (2013.01); *H01L 33/54* (2013.01); *H01L 2224/48091* (2013.01); *H01L 2224/48247* (2013.01); *H01L 2224/73265* (2013.01); *H01L 2933/0091* (2013.01)

(58) Field of Classification Search
CPC .............................. H01L 33/58; H01L 33/54
USPC ....................................................... 257/98, 99
See application file for complete search history.

(56) References Cited

U.S. PATENT DOCUMENTS

2007/0012940 A1* 1/2007 Suh .................. H01L 33/507
257/99
2009/0242917 A1 10/2009 Inoue et al.
2012/0161621 A1* 6/2012 Sato ................... H01L 33/54
313/512

FOREIGN PATENT DOCUMENTS

| CN | 201043719 Y | 4/2008 |
| CN | 101487581 A | 7/2009 |
| CN | 101545610 A | 9/2009 |
| CN | 201651828 | 11/2010 |
| CN | 101925772 A | 12/2010 |
| DE | 202008016868 U1 | 3/2009 |
| EP | 1215735 A1 | 6/2002 |

OTHER PUBLICATIONS

IPRP to PCT International Application No. PCT/CN2012/070069 dated Jul. 17, 2014, (7p).
First Office Action to Chinese Patent Application No. 201280000001.5, dated Jul. 29, 2015 and English Summary, (14p).
Second Office Action and Search Report to Chinese Patent Application No. 201280000001.5, dated Mar. 16, 2016 and English Summary (17 pgs).

* cited by examiner

*Primary Examiner* — Selim Ahmed
(74) *Attorney, Agent, or Firm* — Brinks Gilson & Lione

(57) ABSTRACT

LED devices are provided including an LED package including an LED and an optical element in an optical receiving relationship with the LED. The optical element has a higher light absorbing property at an exit surface away from the LED than at a bottom surface proximal to the LED. The optical element may include different epoxies, dye, and opaque particles. Methods for producing disclosed LED devices are also disclosed.

24 Claims, 9 Drawing Sheets

LED DEVICES WITH REDUCED REFLECTION AND AN LED DISPLAY INCLUDING SAME

RELATED APPLICATIONS

This application is a continuation of International Application No. PCT/CN2012/070069, filed Jan. 5, 2012, the entire content of which is incorporated by reference herein.

FIELD OF THE DISCLOSURE

The disclosure relates, generally, to light emitting diodes (LEDs) and, more particularly, to LED devices with reduced reflection and to LED displays including such devices.

BACKGROUND

In recent years, there have been dramatic improvements in LED technology such that LEDs of increased luminance and color fidelity have been introduced. Due to these improved LEDs and improved image processing technology, large format, full color LED video screens have become available and are now in common use. LED displays typically comprise a combination of individual LED panels providing image resolution determined by the distance between adjacent pixels or "pixel pitch."

Outdoor displays that are intended for viewing from great distances have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, typically comprise panels carrying red, green, and blue LEDs mounted on a single electronic device attached to a driver printed circuit board (PCB) that controls the output of each electronic device.

In order to use an LED chip in conventional applications it is known to enclose an LED chip in a package to provide environmental and/or mechanical protection, color selection, light focusing and the like. An LED package also includes electrical leads, contacts or traces for electrically connecting the LED package to an external circuit. In a typical two-pin LED package/component 10 illustrated in FIG. 1, a single LED chip 12 is mounted on a reflective cup 13 by means of a solder bond or conductive/non-conductive epoxy. One or more wire bonds 11 connect the ohmic contacts of the LED chip 12 to leads 15A and/or 15B, which may be attached to or integral with the reflective cup 13. In FIG. 1, the LED package comprises a vertically oriented LED chip 12 with a conductive growth substrate (p-side up in a group III-nitride LED) or conductive carrier substrate (n-side up) and one wire bond 11. In alternative embodiments, the LED package comprises a laterally oriented LED chip on an insulating substrate with two wire bonds. In certain "flip" chip embodiments, no wire bonds are necessary as would be understood by one of skill in the art. The reflective cup 13 may be filled with a transparent encapsulant material 16 and/or a wavelength conversion material, such as a phosphor, can be included in over the LED chip or in the encapsulant. Light emitted by the LED at a first wavelength may be absorbed by the phosphor, which may responsively emit light at a second wavelength. The entire assembly can then be encapsulated in a clear protective resin 14, which may be molded in the shape of a lens to direct or shape the light emitted from the LED chip 12.

A conventional LED package 20 illustrated in FIG. 2 may be more suited for high power operations which may generate more heat. In the LED package 20, one or more LED chips 22 are mounted onto a ceramic based carrier such as a printed circuit board (PCB) carrier, substrate or submount 23. One or more LED chips 22 may include: a UV, blue or green LED chip, such as a group III nitride based LED chip comprising negatively doped (n-type) epitaxial layer(s) of gallium nitride or its alloys and positively doped (p-type) epitaxial layers of gallium nitride or its alloys surrounding a light emitting active region, a red LED chip, such as an AlInGaP based red LED chip, a white LED chip (e.g., blue LED chip with phosphor(s) layer(s)), and/or a non-white phosphor based LED chip. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 21 are made between ohmic contacts on the LED chips 22 and electrical traces 25A, 25B on the submount 23. The mounted LED chips 22 are then covered with a transparent encapsulant 26, which may provide environmental and mechanical protection to the chips while also acting as a lens. The metal reflector 24 is typically attached to the carrier by means of a solder or epoxy bond.

Conventional LED packages such as those shown in FIGS. 1 and 2 have transparent encapsulant and transparent reflective cups covering LED chips so that light emitted from LED packages can be used efficiently. Those skilled in the art routinely engineer package components to be light transparent and not to absorb any light generated by the LED or irradiating the package from external sources. When used in LED displays, however, the transparent encapsulant and transparent reflective cups in conventional LED packages can reflect too much background light. When viewing displays including conventional LED packages, customers may have a problem viewing the displayed content if the display reflects too much background light. For example, a customer may find it difficult to read the displayed text under the sun if the display reflects most of the sunlight. Thus, there is a need for a display and LED packages that reflect less background light.

Display customers prefer high contrast displays with low reflection. In addition, customers prefer displays with minimum reflection when the displays are exposed to bright background illumination. Accordingly, a new LED device is provided having improved screen contrast and reduced background light reflection.

SUMMARY

One objective of this disclosure is to provide LED devices with decreased reflection to ambient light. The disclosed LED device may be used in LED displays for high quality and high performance video screens.

A first embodiment discloses an LED package including an LED and an optical element in an optical receiving relationship with the LED. The optical element has a higher light absorbing property at an exit surface away from the LED than at a bottom surface proximal to the LED.

A second embodiment discloses an LED package including an LED and an optical element in an optical receiving relationship with the LED. The optical element includes a transparent portion and a semi-transparent portion. The semi-transparent portion has a higher light absorbing property than the transparent portion.

A third embodiment discloses a display including a substrate carrying an array of LED packages arranged in vertical columns and horizontal rows. At least one of the LED packages includes an LED and an optical element in an optical receiving relationship with the LED. The optical element has a higher light absorbing property at an exit surface away from the LED than at a bottom surface proximal to the LED. The display also includes signal processing and LED drive circuitry electrically connected to selectively energize the array of LED packages for producing visual images on the display.

A forth embodiment discloses a display including a substrate carrying an array of LED modules arranged in vertical columns and horizontal rows. At least one of the LED packages includes an LED and an optical element in an optical receiving relationship with the LED. The optical element includes a transparent portion and a semi-transparent portion. The semi-transparent portion has a higher light absorbing property than the transparent portion. The LED display also includes signal processing and LED drive circuitry electrically connected to selectively energize the array of LED packages for producing visual images on the display.

A fifth embodiment discloses a method for producing an LED package. The method includes mixing epoxy A, epoxy B, dye, and opaque particles into a mixture and filling the mixture into a package mold. The package mold has an upright configuration with respect to the LED package. The mixture is cured in the mold to form the LED package. The package mold is positioned upside down with respect to the upright configuration during at least a portion of the curing. The LED package includes an LED and an optical element in an optical receiving relationship with the LED. The optical element has a higher light absorbing property at an exit surface away from the LED than a bottom surface proximal to the LED.

A sixth embodiment discloses a method for producing an LED package. The method includes mixing an epoxy A and an epoxy B, and a dye to form a mixture. The mixture is stirred and air bubbles are removed from the mixture. The mixture is introduced into a package mold and cured in the package mold under a first temperature for a first period. Opaque particles are added to the cured mixture, and the mixture is cured in the package under a second temperature for a second period. The package mold has an upright configuration with respect to the LED package and the package mold is positioned upside down with respect to the upright configuration during at least a portion of the curing.

DETAILED DESCRIPTION

Figure 1:
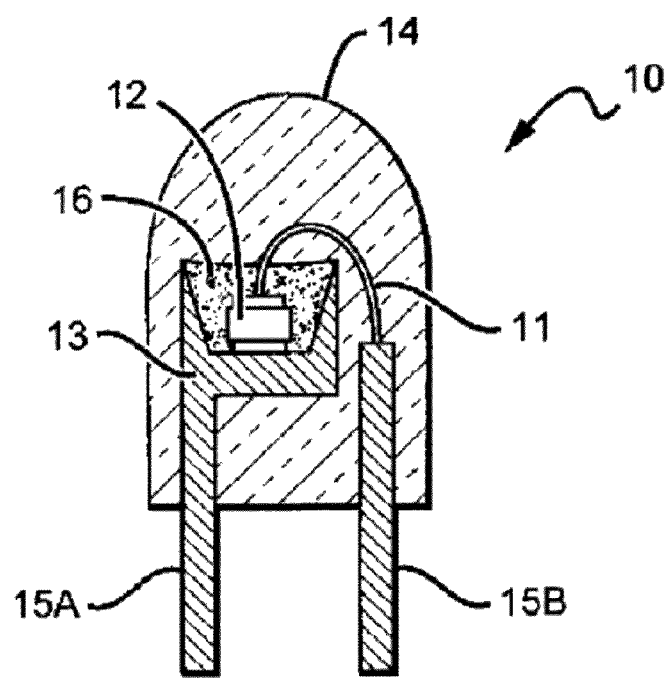
FIG. 1 is a side view of a conventional light emitting diode package.

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
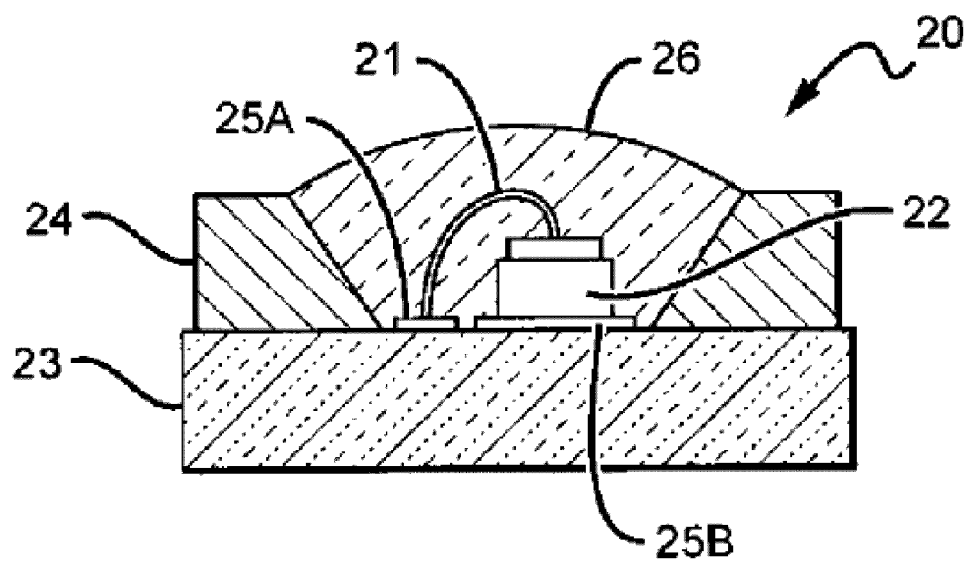
FIG. 2 is a perspective view of another conventional light emitting diode package.
Figure 3:
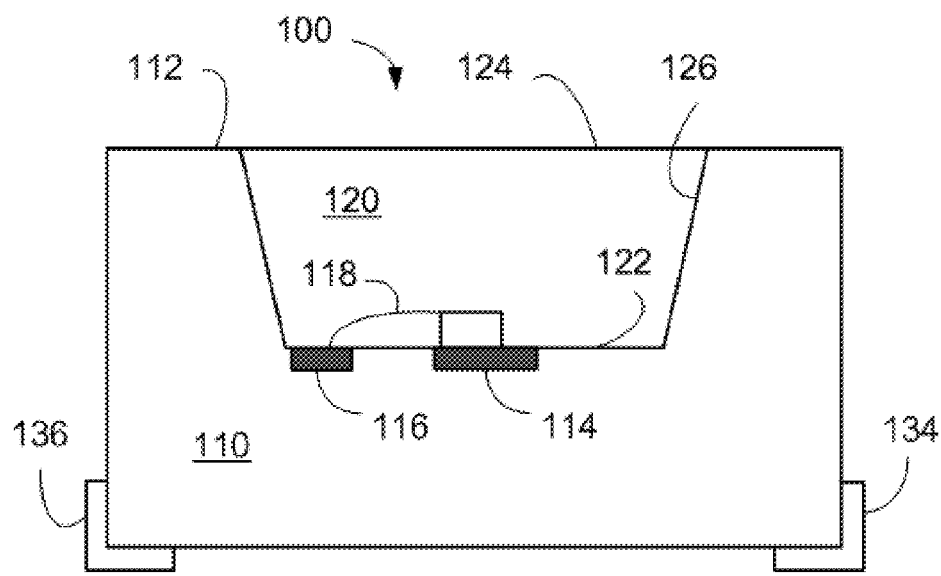
FIG. 3 illustrates a partial cutaway side view of an LED package according to an embodiment of the present disclosure.
Figure 4:
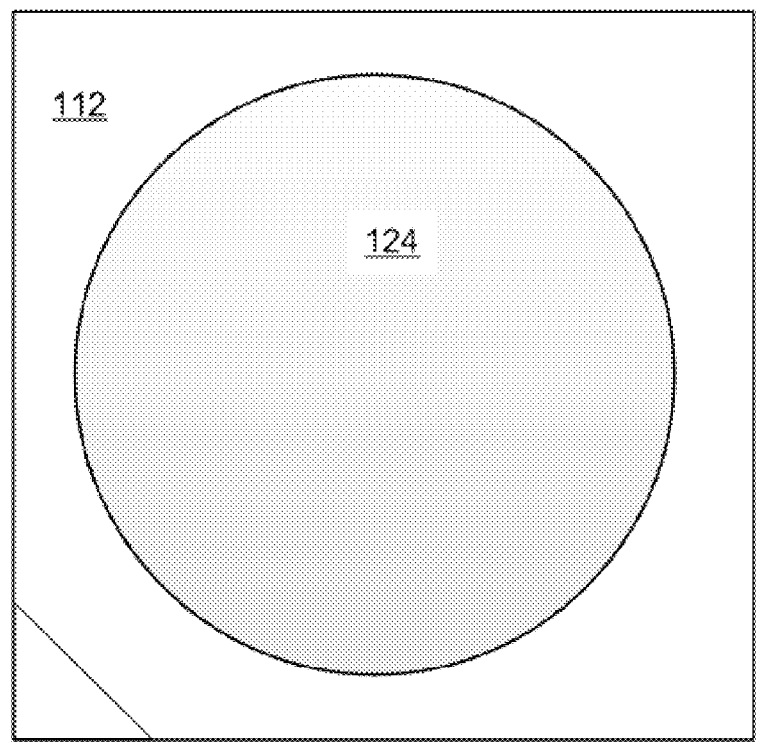
FIG. 4 illustrates a top view of the embodiment illustrated in FIG. 1.

FIGS. 2-4 illustrate an embodiment of an LED package 100 in different views. LED package 100 is a surface mount LED package that can include a number of LEDs and electrical wiring patterns to connect the LEDs to electrical sources as known by those skilled in the art. FIG. 3 is a partial cutaway side view of LED package 100. LED package 100 includes an LED 130 and an optical element 120 in an optical receiving relationship with LED 130. LED package 100 also includes an outer portion 110 surrounding optical element 120 and LED 130. Outer portion 110 has an upper surface 112 and houses binding pads 114 and 116 coupled respectively to lead frame leads 134 and 136. Optical element 120 has a bottom surface 122 and a wall surface 126. Wall surface 126 may be inclined relative to bottom surface 122 and defines an exit surface 124 at an upper end of optical element 120. LED 130 is disposed on bonding pad 114 on the bottom surface 122 and electrically connected to bonding pad 116 via a conductive wire 118. LED package 100 may include multiple LEDs emitting different colors or same color.

In some embodiments, outer portion 110 may be made from plastic, ceramic materials, or other materials known in the field. Optical element 120 may be a reflector cup at least partially filled with encapsulant material that covers and protects LED 130. Optical element 120 may be formed from a silicone, resin, an epoxy, a thermoplastic polycondensate, glass, and/or other suitable material or combinations of materials. Optical element 120 and outer portion 110 usually have different optical properties. For example, outer portion 110 may include dark color polyphthalamide (PPA) that absorbs most light and optical element 120 may mostly include transparent material that absorbs light much less than outer portion 110. Thus, most of the light emitted from LED 130 exits from LED package 100 through exit surface 124.

FIG. 4 illustrates a top view of the LED package illustrated in FIG. 1. In the illustrated embodiment, optical element 120 has a circular shape surrounded by upper surface 112. However, those skilled in the art will appreciate that optical element 120 and upper surface 112 may have other shapes.

Figure 5:
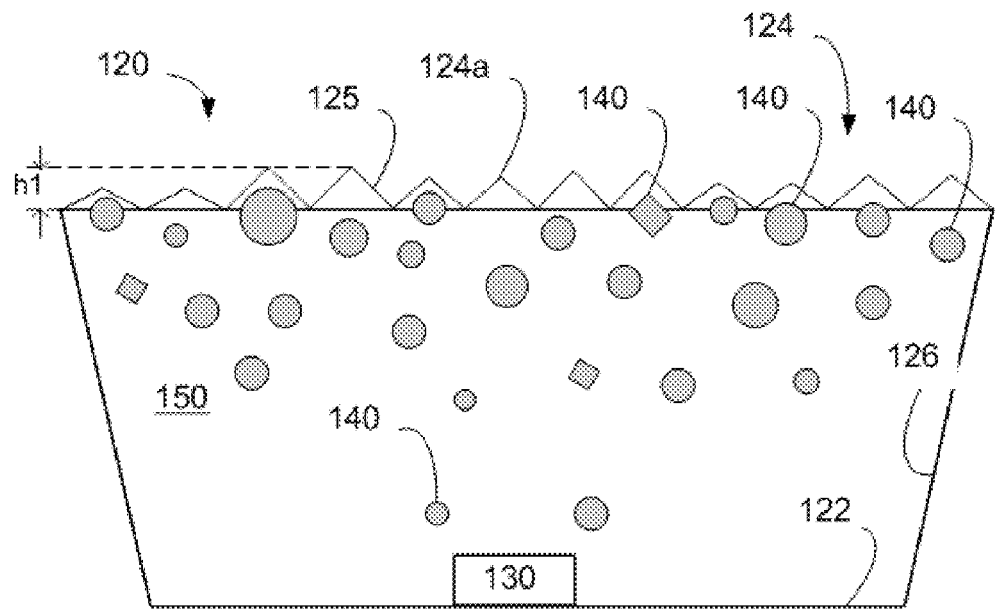
FIG. 5 illustrates a first embodiment the optical element of FIG. 1.

FIG. 5 illustrates a first embodiment of LED package 100 and optical element 120 in wall surface 126. In this embodiment, optical element 120 includes opaque particles 140 having an increased particle density towards exit surface 124, such that a particle density in proximity to exit surface 124 is greater than the particle density in proximity to LED 130 on bottom surface 122. With a graded particle density, most light can still pass through optical element 120. Opaque particles 140 may include fused silica, $SiO_2$, $CaCO_3$, black agent, light reflecting particle, and the like. Those skilled in the art will recognize that opaque particles 140 may have a constant spatial concentration, or a graded concentration or the like. In the instant embodiment, enhanced performance is achieved where the volumetric particle density in proximity to exit surface 124 is greater than the particle density in proximity to LED 130.

In this embodiment, optical element 120 includes a semi-transparent portion having opaque particles 140 scattered between bottom surface 122 and exit surface 124. Exit surface 124 thus has a rough exterior surface 124a. Rough exterior surface 124a has irregular patterns 125 that scatter light originating from outside the LED package and freely transmit light emitted from LED 130. Rough surface 124a may have a reflectivity preferably in the range of about 0.6 to about 0.95, and more preferably in the range of about 0.88 to about 0.92, and most preferably at about 0.9. Rough surface 124a preferably have a thickness in the range of about 0.01 mm to 0.2 mm, more preferably in the range of about 0.04 mm to about 0.08 mm, and most preferably at about 0.06 mm. Those skilled in the art will recognize that a rough exterior surface 124a may be created by other ways, for example, by forming physical features in exit surface 124, such as pits, grooves, and the like, or by forming an antireflective layer on top of exit surface 124.

Preferably, irregular patterns 125 have a maximum height h1 of less than about 2.0 um, more preferably, irregular patterns 125 have a maximum height h1 of less than about 1.5 um. Preferably, opaque particles 140 reduce a luminous intensity from the LED by less than about 10.0%, more preferably, less than about 5.0%. Correspondingly, opaque particles 140 weights preferably less than about 0.03% of optical element 120, more preferably less than about 0.003% of optical element 120.

In some embodiments, opaque particles 140 may have irregular shapes. Opaque particles 140 may include many kinds of particles with different shapes and sizes. For example, opaque particles 140 may include a first plurality of particle with an average diameter less than about 14 nm, a second plurality of particle with an average diameter less than about 4.5 um, and a third plurality of particle with an average diameter of about 4.5 um to 24 um. Preferably, opaque particles 140 have average diameters less than about 0.03 mm.

In some embodiments, semi-transparent portion 150 further includes epoxy A, epoxy B, and opaque particles. Epoxy A and the epoxy B may have similar compositional weight. For example, a weight ratio between epoxy A and the epoxy B may be 1:1, 1:0.8, or 1.2:1 depending on the epoxy properties. In another example, a weight ratio between epoxy A and epoxy B is preferably less than about 10:13, or more preferably about 10:10 to about 10:13. Preferably, the opaque particles comprise less than about 0.03% of a total weight of the epoxy A and the epoxy B, more preferably, less than about 0.007% of a total weight of the epoxy A and the epoxy B, and most preferably, 0.003% of a total weight of the epoxy A and the epoxy B.

Figure 6:
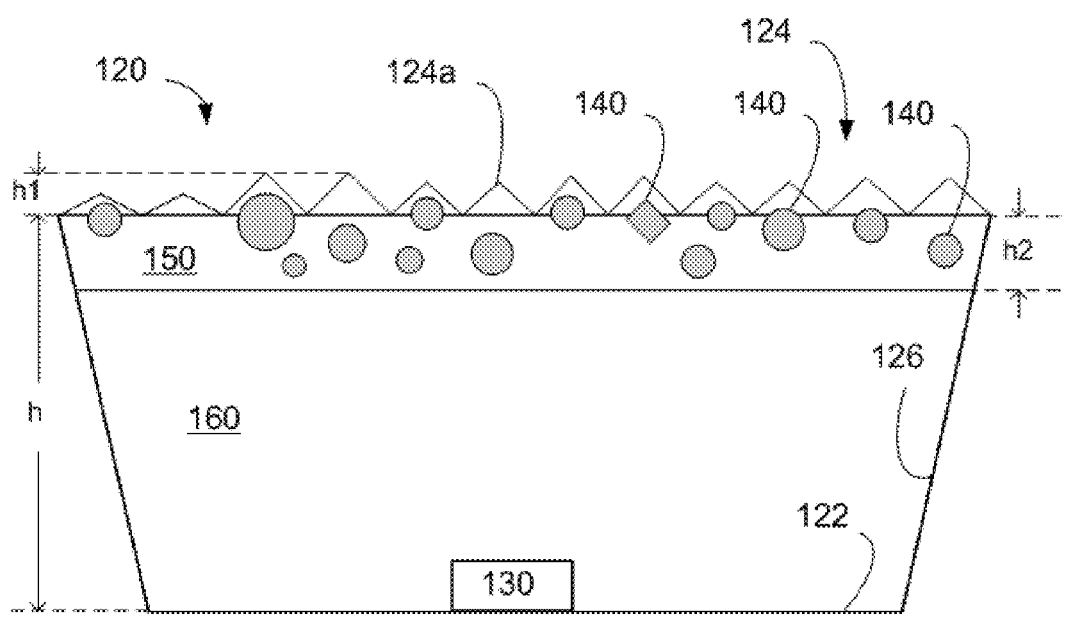
FIG. 6 illustrates a second embodiment of the optical element of FIG. 1.

FIG. 6 illustrates a second embodiment of LED package 100 and optical element 120. In this embodiment, optical element 120 includes a semi-transparent portion 150 disposed on a transparent portion 160. Semi-transparent portion 150 has a higher light absorbing property than transparent portion 160. Similarly, semi-transparent portion 150 includes opaque particles 140 or dye that matches the color emitted from LED 130. In FIG. 6, opaque particles 140 in semi-transparent portion 150 have a random concentration. However, those skilled in the art will recognize that opaque particles 140 may have a constant concentration, or graded concentration as long as semi-transparent portion 150 provides a higher light absorbing property than transparent portion 160. Semi-transparent portion 150 has a profile thickness h2 which is about ⅙ to ¼ of the total profile thickness h of optical element 120. Semi-transparent portion 150 has an increasing light absorbing property along a light path emitted from LED 130. Preferably, semi-transparent portion 150 has a thinner profile thickness than transparent portion 160. Preferably, semi-transparent portion 150 has a profile thickness h2 of less than about 0.4 mm, and more preferably, less than about 0.3 mm.

Compared with the first embodiment, semi-transparent portion 150 has a thinner profile thickness. In accordance with various aspects of the disclosure, the LED package includes appropriate opaque particle sizes and different profile thicknesses to achieve a balance between the luminous intensity and the surface reflection of the LED packages.

Figure 7:
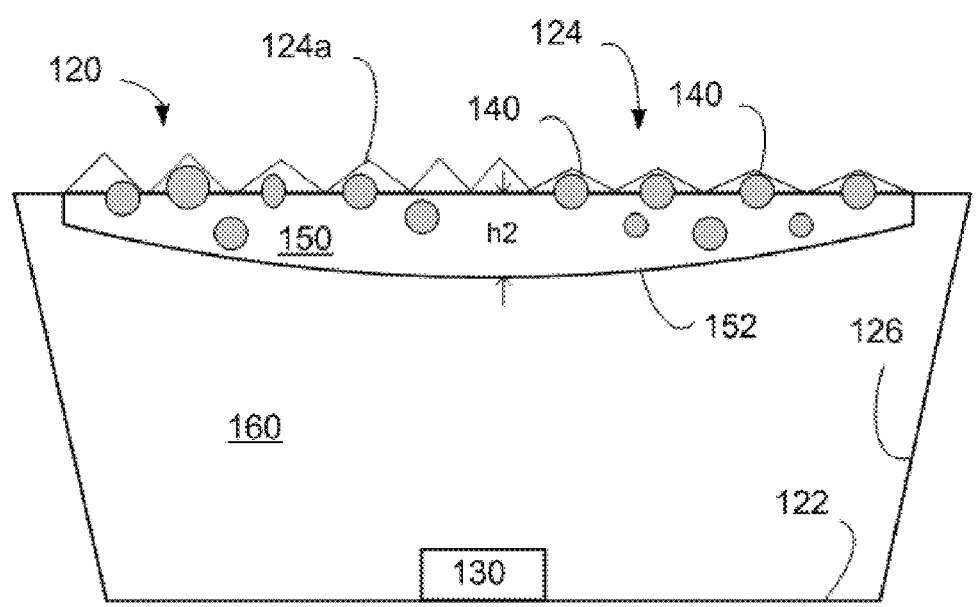
FIG. 7 illustrates a third embodiment of the optical element of FIG. 1.

FIG. 7 illustrates a second embodiment of LED package 100 and optical element 120. In the instant embodiment, semi-transparent portion 150 has a rounded shape. Semi-transparent portion 150 has a rough exterior surface 124a with a surface area that covers a portion of exit surface 124. Semi-transparent portion 150 also has a curved bottom surface 152. Rough surface 124a may have a reflectivity preferably in the range of about 0.6 to about 0.95, and more preferably in the range of about 0.88 to about 0.92, and most preferably at about 0.9.

The different embodiments disclosed in FIGS. 5-7 provides a higher light absorbing property at exit surface 124 away from LED 130 than a bottom surface 122 proximal to LED 130. The density of opaque particles 140 in optical element 120 may have a random density, a graded density, or a combination of random density and graded density as long as optical element provides a higher light absorbing property at exit surface 124 away from LED 130 than a bottom surface 122 proximal to LED 130. Further, an extra antireflective layer may be added on top of exit surface 124 to reduce reflection. Those skilled in the art will recognize that the foregoing embodiments may be combined into various ways to produce LED packages with desired optical reflectance parameters.

Figure 8:
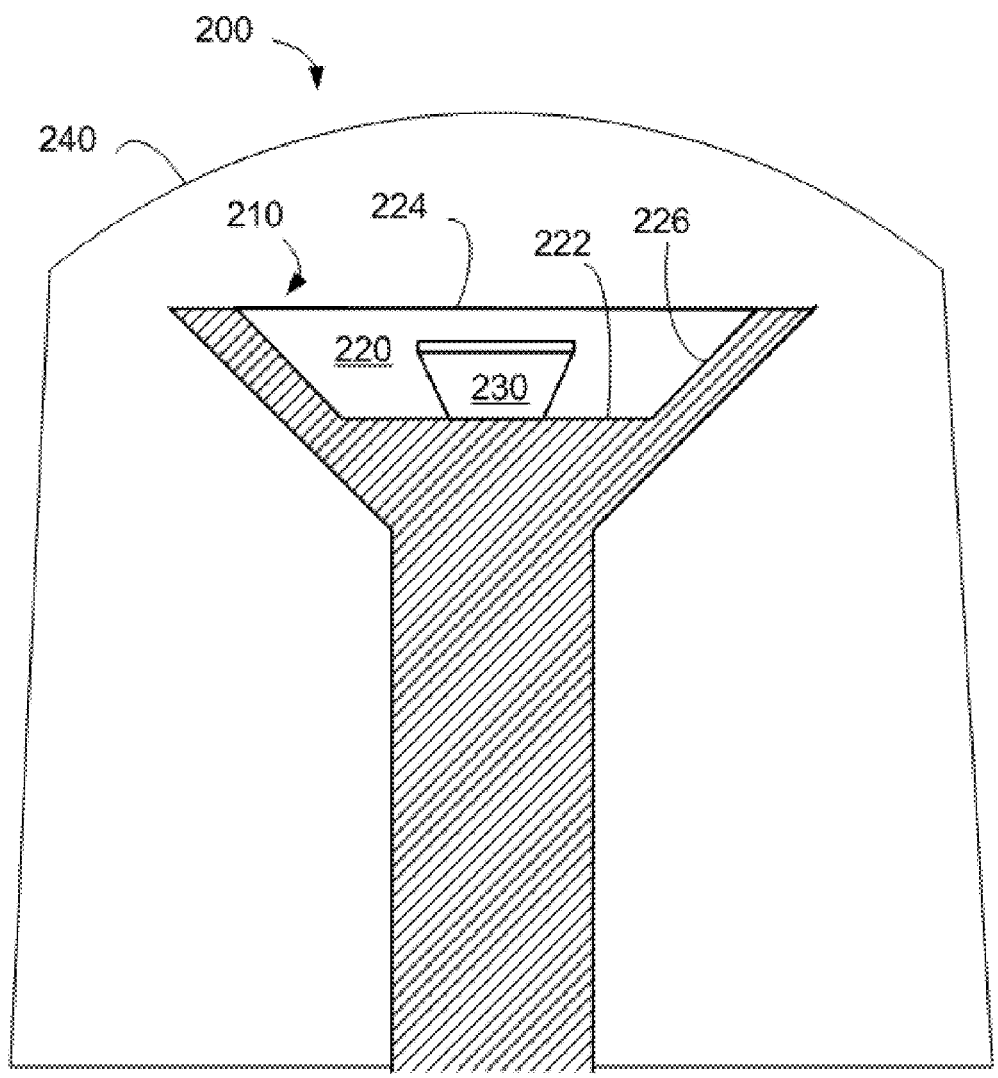
FIG. 8 illustrates a partial cutaway side view of another embodiment of an LED package.

FIG. 8 illustrates partial cutaway side view of an embodiment of a diode-type LED device 200. Diode-type LED device 200 includes a package including an LED with two connecting pins. In the instant embodiment, LED package 200 includes a dome-shaped lens 240 that at least partially covers an LED package 210. LED package cup 210 includes an LED 230 and an optical element 220 in an optical receiving relationship with LED 230. LED 230 is disposed on a bottom surface 222 and is surrounded by a wall surface 226.

Dome-shaped lens 240 may be dyed with different colors that matches the light emitted from LED 230. Optical element 220 may have a structure similar to optical 120 illustrated in FIGS. 5-7. For example, optical element 220 includes opaque particles such that a particle density in proximity to an exit surface 224 is greater than the particle density in proximity to LED 230.

Figure 9:
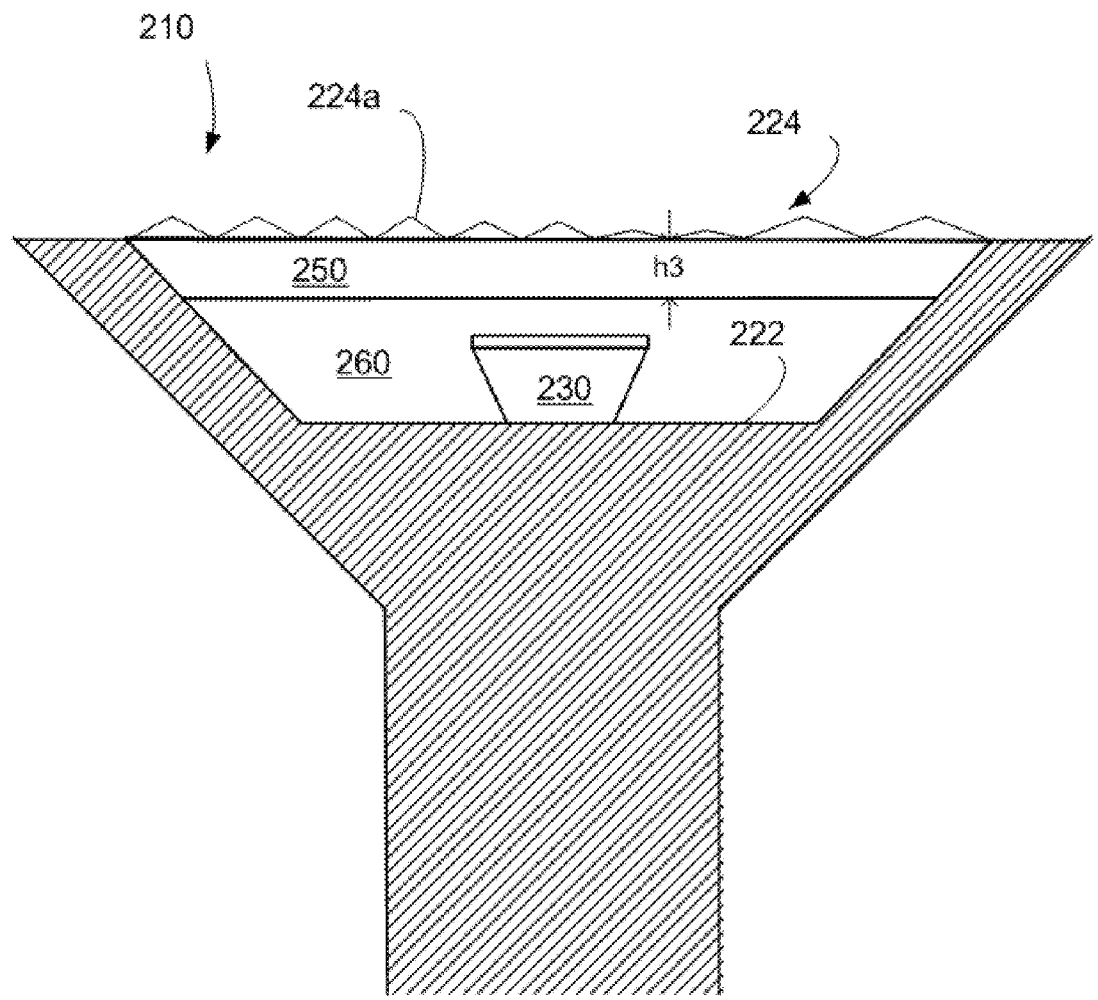
FIG. 9 illustrates a partial cutaway profile view of the embodiment of FIG. 8.

FIG. 9 illustrates a partial cutaway profile view of LED device in FIG. 8. LED package 210 includes a semi-transparent portion 250 disposed on a transparent portion 260. Semi-transparent portion 250 and transparent portion 260 have similar structures and compositions as semi-transparent portion 150 and transparent portion 160 in FIG. 6. Preferably, semi-transparent portion 250 has a thinner profile thickness h3 than transparent portion 260. In one embodiment, semi-transparent portion 250 has a profile thickness h3 that is about ⅙ to ¼ of the total profile height from bottom surface 222 to exit surface 224. Preferably, semi-transparent portion 250 has a profile thickness h3 of less than about 0.4 mm in some embodiments, more preferably, less than about 0.3 mm.

The different embodiments disclosed in FIGS. 8-9 provides a higher light absorbing property at exit surface 224 away from LED 230 than a bottom surface 222 proximal to LED 230. Additionally or alternatively, LED package 200 may have a graded particles concentration that increases as approach exit surface 224, a discrete particle layer, discrete layer of material, encapsulant with homogenous concentration of light absorbing particles.

Figure 10:
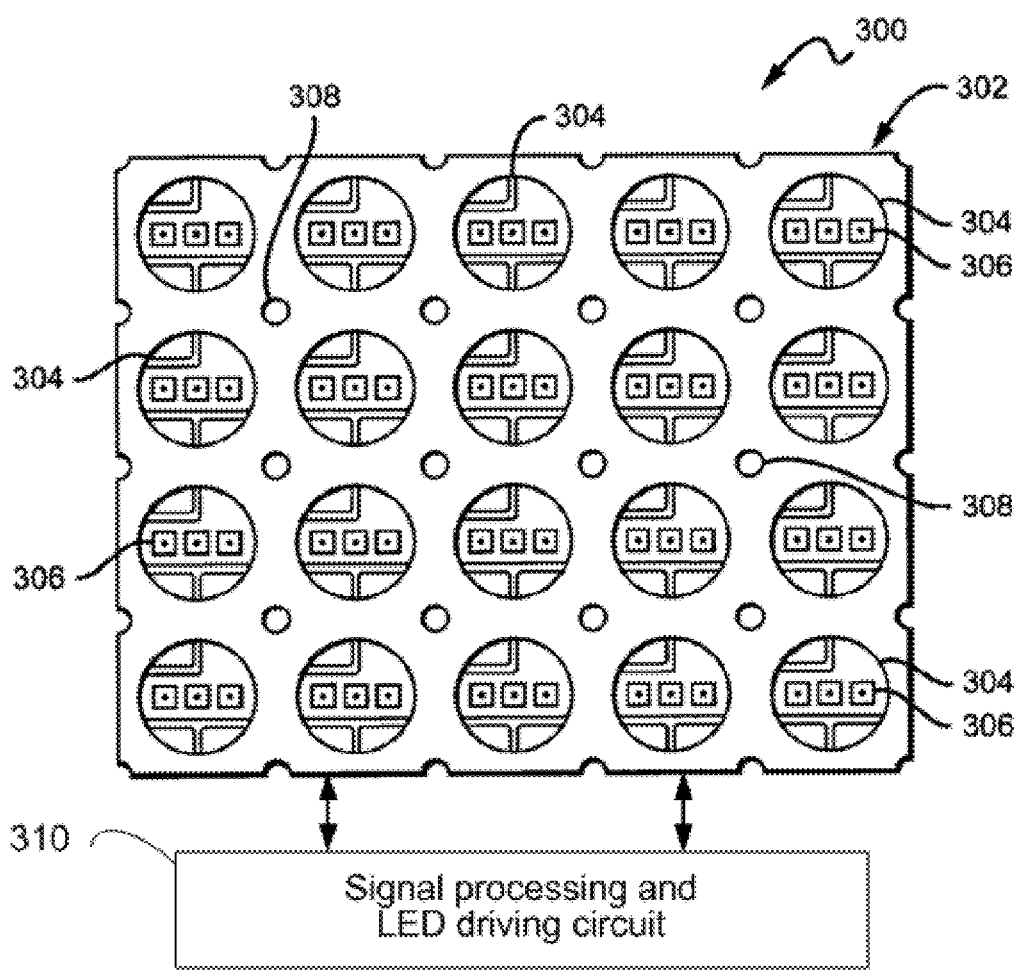
FIG. 10 illustrates a plan view of a portion of an LED display screen incorporating LED devices in accordance with embodiments of the disclosure.

FIG. 10 is a plan view of a portion of an LED display screen 300, for example, a display screen including a driver PCB 302 carrying a large number of LED devices 304 arranged in rows and columns. Display screen 300 is divided into a plurality of pixels, each having an LED device 304 and each LED device includes a substrate carrying a plurality of LEDs 306. There may be a plurality of LED devices 304 in a pixel. Each LED device may be driven by different voltage levels. LED devices 304 include LED packages such as those described above and illustrated in FIGS. 2-9. The LED devices are electrically connected to metal traces or pads (not shown) on PCB 302 that connected the LEDs to appropriate electrical signal processing and driver circuitry 310. The signal processing and LED drive circuitry 310 are electrically connected to selectively energize LEDs 306 in LED devices 304 for producing visual images on the display. There may be holes 308 between pixels used to anchor the PCB 302 to mounting platforms.

Figure 11:
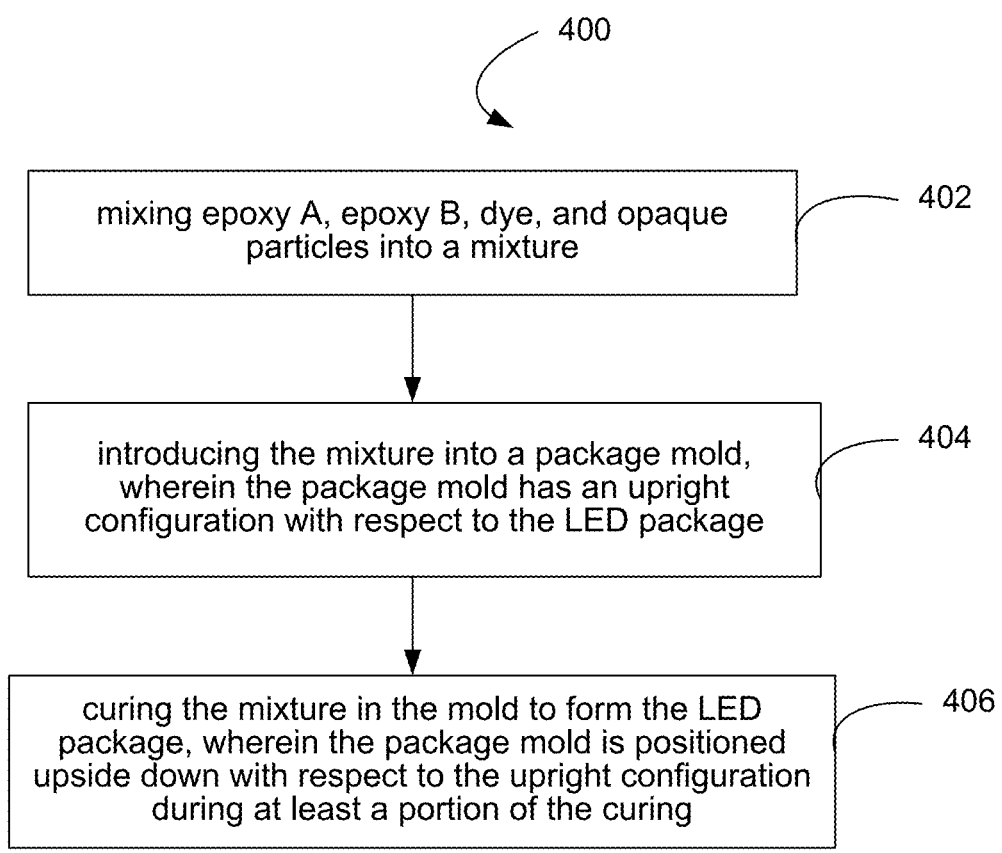
FIG. 11 is a flow chart of exemplary process steps in accordance with a first method for producing an LED package.

FIG. 11 is a flow chart of exemplary process steps in accordance with a first method 400 for producing an LED package having a graded opaque particle density such as disclosed in FIGS. 3-5. The method 400 uses some standard equipment know in the field such as blenders for mixing different material, vacuums for remove air bubbles, and ovens for curing, and the like. In step 402, mixing epoxy A, epoxy B, dye, and opaque particles are combined into a mixture. In one embodiment, the mixing ratio between epoxy A, epoxy B, dye, and opaque particles can be found as described above. The dye includes at least one of the following: red dye, green dye, or blue dye. The mixing process of step 402 is preferably preformed about 10 minutes.

In step 404, the mixture is introduced into a package mold. The package mold has an upright configuration with respect to the LED package. In step 406, the mixture is cured in the mold to form the LED package. The package mold is positioned upside down with respect to the upright configuration during at least a portion of the curing procedure. In some embodiments, the curing temperature is preferably less than about 200° C., more preferably, less than about 190° C., most preferably, less than about 180° C. Alternatively or additionally, the curing temperature is preferably about 140° C. to about 200° C., more preferably, about 150° C. to 190° C., most preferably, about 160° C. to about 180° C. Preferably, the curing is less than about 4 hours, and more preferably, between 3 hours and 4 hours.

The method 400 may also include stirring the mixture and removing air bubbles from the mixture. After curing, a produced LED package includes an LED and an optical element in an optical receiving relationship with the LED. The optical element has a higher light absorbing property at an exit surface away from the LED. In this method, the LED package works as a tool for moving mixture before curing and a container for the final product after curing. The method 400 may further include a step of attaching a lead frame to the package after or during the curing step.

Figure 12:
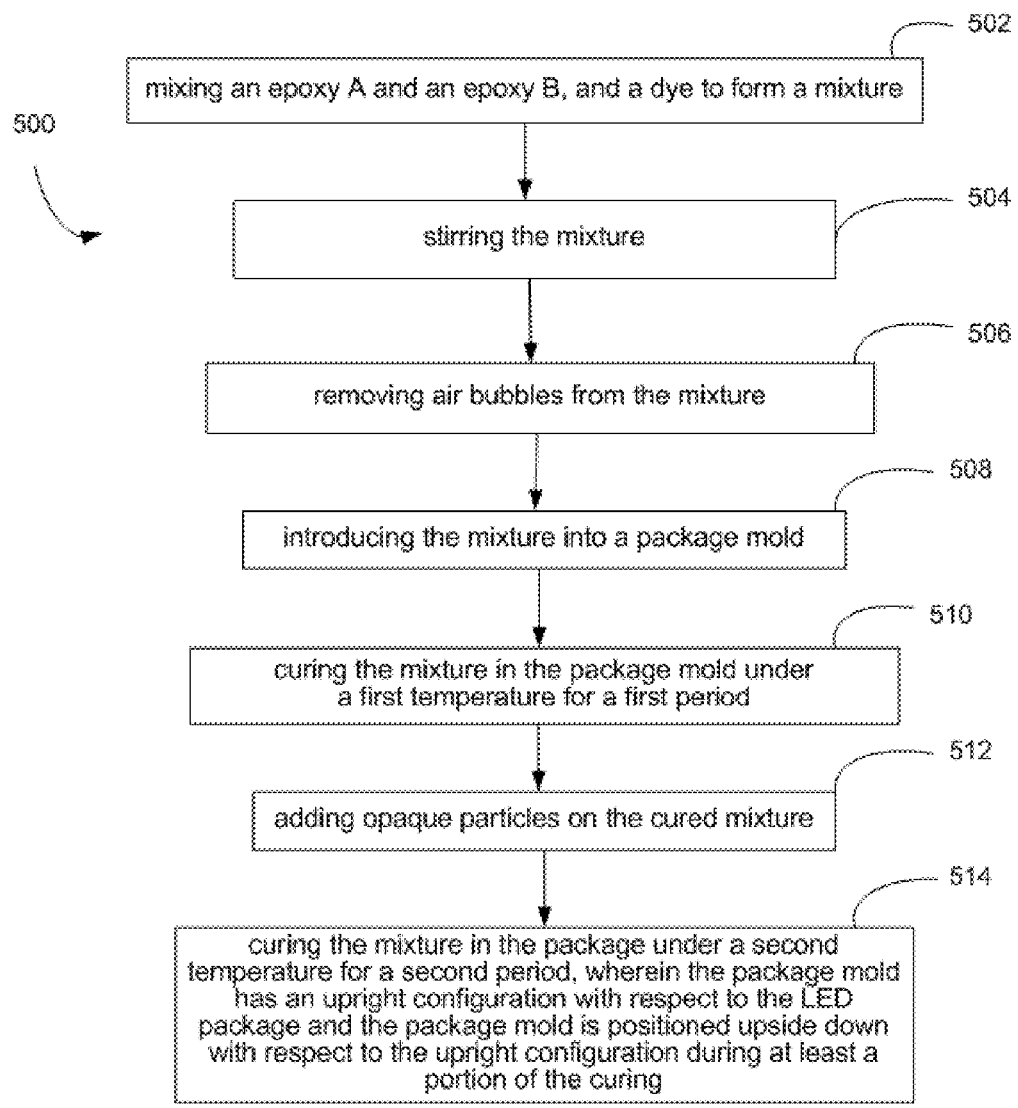
FIG. 12 is a flow chart of exemplary process steps in accordance with a second method for producing an LED package.

FIG. 12 is a flow chart of exemplary process steps in accordance with a second method 500 for producing an LED package such as disclosed in FIGS. 6-9. In step 502, an epoxy A and an epoxy B, and a dye are added to form a mixture. In step 504, the mixture is stirred for approximately 5 to 30 minutes. The viscosity of epoxy may be tested by a viscosity meter during stirring. If the viscosity of epoxy is greater than about 3500 mPa·S, the epoxy A may be pre-heated for at 50 C for about 10-15 minutes to make the viscosity down to below 2500 mPa·S so that it can be stirred better and easy to de-bubble. The stirring may be done by operators for about 10-15 minutes. Alternatively, the stirring may be done by a stir machine in a 2-step process. In the first step, the stir machine operates at about 1000 rpm for about 4 minutes at 0.2 kPa. In the second step, the stir machine operates at about 600 rpm for about 2 minutes at 0.2 kPa. In step 506, air bubbles are removed from the mixture in a vacuum environment. In step 508, the mixture is introduced into a package mold. In step 510, the mixture is cured in the package mold under a first curing temperature for a first curing period. The first curing temperature is preferably less than about 120° C., and more preferably, about 120° C. to about 140° C. The first curing period is less than about 1.5 hours.

In step 512, opaque particles are added to the cured mixture to form a semi-transparent layer with a desired thickness.

In step 514, the mixture is cured again in the package under a second curing temperature for a second curing period. The second curing temperature is preferably less than about 180° C., more preferably, about 140° C. to about 180° C. Preferably, the second curing period is longer than the first curing period. The disclosed process steps are illustrated in FIGS. 11-12 for exemplary purpose only, those skilled in the art will appreciate that it is not necessary to completely implement the process steps in the illustrated order.

The package mold has an upright configuration with respect to the LED package and the package mold is positioned upside down with respect to the upright configuration during at least a portion of the curing. The curing forms an LED package having a concentration gradient of opaque particles, such that the concentration of opaque particles varies from an upper portion of the LED package to a lower portion of the LED package. Thus, more opaque particles are disposed close to form a rough exit surface of the LED package. Most of the light emitted from the LED can freely transmit through the rough exit surface and the reflected background light is reduced.

It is therefore intended that the foregoing detailed description be regarded as illustrative rather than limiting, and that it be understood that it is the following claims, including all equivalents, that are intended to define the spirit and scope of this disclosure.

The invention claimed is:

1. A light emitting diode (LED) package comprising:
an LED; and
an optical element in an optical receiving relationship with the LED, wherein the optical element has a higher light absorbing property at an exit surface away from the LED than at a bottom surface proximal to the LED, wherein the optical element comprises semi-transparent portion that comprises epoxy A, epoxy B, and opaque particles, and
wherein the opaque particles comprise less than about 0.03% of a total weight of the epoxy A and the epoxy B.

2. The LED package of claim 1, wherein the optical element comprises opaque particles having a graded particle density, such that a particle density in proximity to the exit surface is greater than the particle density in proximity to the LED.

3. The LED package of claim 1, wherein the exit surface has a rough exterior surface.

4. The LED package of claim 3, wherein the rough exterior surface has irregular patterns that scatter light originating from outside the LED package and freely transmit light emitted from the LED.

5. The LED package of claim 4, wherein the irregular patterns have a maximum height of less than about 2.0 um.

6. The LED package of claim 4, wherein the irregular patterns have a maximum height of less than about 1.5 um.

7. The LED package of claim 3, wherein the opaque particles have diameters less than about 0.03 mm.

8. The LED package of claim 1, wherein a weight ratio between the epoxy A and the epoxy B is in a range from 1:1 to 1:0.8 or less than 1:1.

9. The LED package of claim 1, wherein the epoxy A and the epoxy B comprise less than about 0.007% of a total weight of the epoxy A and the epoxy B.

10. The LED package of claim 1, wherein the opaque particles comprise less than about 0.003% of a total weight of the epoxy A and the epoxy B.

11. The LED package of claim 1, wherein the semi-transparent portion reduces a luminous intensity from the LED by less than about 10.0%.

12. The LED package of claim 11, wherein the semi-transparent portion reduces a luminous intensity from the LED by less than about 5.0%.

13. A light emitting diode (LED) package comprising:
an LED; and
an optical element in an optical receiving relationship with the LED, wherein the optical element comprises a transparent portion and a semitransparent portion, and wherein the semi-transparent portion has a higher light absorbing property than the transparent portion,
wherein the semi-transparent portion further comprises epoxy A, epoxy B, and opaque particles, the opaque particles comprise less than about 0.03% of a total weight of the epoxy A and the epoxy B.

14. The LED package of claim 13, wherein the semi-transparent portion comprises opaque particles having diameters less than about 0.03 mm.

15. The LED package of claim 13, wherein the semi-transparent portion has a profile thickness less than about 0.4 mm.

16. The LED package of claim 13, wherein the semi-transparent portion has an increasing light absorbing property along a light path emitted from the LED, and the semi-transparent portion has a thinner profile thickness than the transparent portion.

17. The LED package of claim 13, wherein the semi-transparent portion has a rough exterior surface away from the LED.

18. The LED package of claim 17, wherein the rough exterior surface has irregular patterns that scatter light from outside and freely transmit light emitted from the LED.

19. The LED package of claim 18, wherein the irregular patterns has a maximum height of less than about 2.0 um.

20. The LED package of claim 18, wherein the irregular patterns has a maximum height of less than about 1.5 um.

21. The LED package of claim 13, wherein the opaque particles comprise less than about 0.007% of a total weight of the epoxy A and the epoxy B.

22. The LED package of claim 13, wherein the opaque particles comprise less than about 0.003% of a total weight of the epoxy A and the epoxy B.

23. The LED package of claim 13, wherein the semi-transparent portion reduces a luminous intensity from the LED by less than about 1 0.0%.

24. The LED package of claim 13, wherein the semi-transparent portion reduces a luminous intensity from the LED by less than about 5.0%.

* * * * *